(12) United States Patent
Zhou et al.

(10) Patent No.: US 11,563,059 B2
(45) Date of Patent: Jan. 24, 2023

(54) DISPLAY SUBSTRATE HAVING AUXILIARY ELECTRODE LAYER ELECTRICALLY CONNECTED TO FIRST ELECTRODE DISPLAY APPARATUS, AND METHOD OF FABRICATING DISPLAY SUBSTRATE

(71) Applicant: BOE Technology Group Co., Ltd., Beijing (CN)

(72) Inventors: Tingting Zhou, Beijing (CN); Chengchung Yang, Beijing (CN); Bin Zhang, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 978 days.

(21) Appl. No.: 16/330,561

(22) PCT Filed: Jul. 27, 2018

(86) PCT No.: PCT/CN2018/097479
§ 371 (c)(1),
(2) Date: Mar. 5, 2019

(87) PCT Pub. No.: WO2019/080564
PCT Pub. Date: May 2, 2019

(65) Prior Publication Data
US 2021/0367003 A1 Nov. 25, 2021

(30) Foreign Application Priority Data

Oct. 27, 2017 (CN) .......................... 201711033037.4

(51) Int. Cl.
*H01L 27/32* (2006.01)
*H01L 51/52* (2006.01)
*H01L 51/56* (2006.01)

(52) U.S. Cl.
CPC ...... *H01L 27/3218* (2013.01); *H01L 27/3246* (2013.01); *H01L 27/3276* (2013.01);
(Continued)

(58) Field of Classification Search
CPC ............. H01L 27/3218; H01L 27/3246; H01L 27/3248; H01L 27/3253;
(Continued)

(56) References Cited

U.S. PATENT DOCUMENTS 11,211,442 B2 * 12/2021 Wang .................. H01L 27/3272
2013/0015449 A1 1/2013 Lee et al.
(Continued)

FOREIGN PATENT DOCUMENTS

CN      101123257 A      2/2008
CN      102306650 A      1/2012
(Continued)

OTHER PUBLICATIONS

International Search Report & Written Opinion dated Sep. 27, 2018, regarding PCT/CN2018/097479.
(Continued)

*Primary Examiner* — Steven B Gauthier
*Assistant Examiner* — Candice Chan
(74) *Attorney, Agent, or Firm* — Intellectual Valley Law, P.C.

(57) ABSTRACT

The present application provides a display substrate having a plurality of subpixel areas. The display substrate includes a base substrate; a first electrode layer on the base substrate and including a plurality of first electrodes respectively in the plurality of subpixel areas; an auxiliary electrode layer; and an insulating layer between the first electrode layer and the auxiliary electrode layer. The first electrode layer and the auxiliary electrode layer are spaced apart and insulated from each other by the insulating layer. An orthographic projec-
(Continued)

tion of each individual one of the plurality of first electrodes on the base substrate at least partially overlap with an orthographic projection of the auxiliary electrode layer on the base substrate. Each of the plurality of first electrodes is electrically connected to a pixel circuit configured to drive light emission in a respective one of the plurality of subpixel areas.

18 Claims, 14 Drawing Sheets

(52) U.S. Cl.
 CPC .......... *H01L 51/5212* (2013.01); *H01L 51/56* (2013.01); *H01L 2227/323* (2013.01)
(58) Field of Classification Search
 CPC ... H01L 27/3276–3279; H01L 27/3297; H01L 27/3244–3279; H01L 51/5212; H01L 51/5206–5218; H05B 33/0896; G09G 2300/0443–0447
 See application file for complete search history.

(56) References Cited

U.S. PATENT DOCUMENTS

| | | |
|---|---|---|
| 2014/0125578 A1 | 5/2014 | Zhou |
| 2014/0146261 A1 | 5/2014 | Wu |
| 2016/0180769 A1 | 6/2016 | Wacyk |

FOREIGN PATENT DOCUMENTS

| | | |
|---|---|---|
| CN | 102629446 A | 8/2012 |
| CN | 102629607 A | 8/2012 |

OTHER PUBLICATIONS

First Office Action in the Chinese Patent Application No. 201711033037. 4, dated Nov. 2, 2018; English translation attached.
Second Office Action in the Chinese Patent Application No. 201711033037.4, dated Jun. 3, 2019; English translation attached.

* cited by examiner

DISPLAY SUBSTRATE HAVING AUXILIARY ELECTRODE LAYER ELECTRICALLY CONNECTED TO FIRST ELECTRODE DISPLAY APPARATUS, AND METHOD OF FABRICATING DISPLAY SUBSTRATE

CROSS-REFERENCE TO RELATED APPLICATION

This application is a national stage application under 35 U.S.C. § 371 of International Application No. PCT/CN2018/097479, filed Jul. 27, 2018, which claims priority to Chinese Patent Application No. 201711033037.4, filed Oct. 27, 2017, the contents of which are incorporated by reference in the entirety.

TECHNICAL FIELD

The present invention relates to display technology, more particularly, to a display substrate, a display apparatus, and a method of fabricating a display substrate.

BACKGROUND

Organic light emitting diode (OLED) display apparatuses are self-emissive devices, and do not require backlights. OLED display apparatuses also provide more vivid colors and a larger color gamut as compared to the conventional liquid costal display (LCD) apparatuses. Further, OLED display apparatuses can be made more flexible, thinner, and lighter than a typical LCD.

SUMMARY

In one aspect, the present invention provides a display substrate having a plurality of subpixel areas, comprising a base substrate; a first electrode layer on the base substrate and comprising a plurality of first electrodes respectively in the plurality of subpixel areas; an auxiliary electrode layer; and an insulating layer between the first electrode layer and the auxiliary electrode layer; wherein the first electrode layer and the auxiliary electrode layer are spaced apart and insulated from each other by the insulating layer; an orthographic projection of each individual one of the plurality of first electrodes on the base substrate at least partially overlap with an orthographic projection of the auxiliary electrode layer on the base substrate; and each of the plurality of first electrodes is electrically connected to a pixel circuit configured to drive light emission in a respective one of the plurality of subpixel areas.

Optionally, the auxiliary electrode layer comprises a plurality of auxiliary electrodes; and an orthographic projection of each individual one of the plurality of auxiliary electrodes on the base substrate at least partially overlaps with an orthographic projection of one or multiple of the plurality of first electrodes on the base substrate.

Optionally, the orthographic projection of each individual one of the plurality of auxiliary electrodes on the base substrate at least partially overlaps with a respective one of the plurality of first electrodes on the base substrate.

Optionally, an orthographic projection of each of two adjacent first electrodes of the plurality of first electrodes respectively in two adjacent subpixel areas of the plurality of subpixel areas at least partially overlaps with an orthographic projection of a same individual one of the plurality of auxiliary electrodes.

Optionally, an orthographic projection of each of two adjacent auxiliary electrodes of the plurality of auxiliary electrodes on the base substrate at least partially overlaps with an orthographic projection of a same individual one of the plurality of first electrodes.

Optionally, an orthographic projection of each of two adjacent first electrodes of the plurality of first electrodes respectively in two adjacent subpixel areas of the plurality of subpixel areas at least partially overlaps with an orthographic projection of a same individual one of the plurality of auxiliary electrodes; and an orthographic projection of each of two adjacent auxiliary electrodes of the plurality of auxiliary electrodes on the base substrate at least partially overlaps with an orthographic projection of a same individual one of the plurality of first electrodes.

Optionally, the plurality of auxiliary electrodes are spaced apart from each other.

Optionally, the plurality of auxiliary electrodes interconnect with each other and constitute an integral electrode layer.

Optionally, the display substrate comprises a plurality of vias extending through the auxiliary electrode layer; and each individual one of the plurality of first electrodes is electrically connected to the pixel circuit through a respective one of the plurality of vias.

Optionally, the display substrate further comprises a pixel definition layer for defining a plurality of pixel apertures; wherein the insulating layer is on a side of the pixel definition layer and the first electrode layer facing the base substrate.

Optionally, thicknesses of the insulating layer respectively in three adjacent subpixel areas are different from each other; the first electrode layer is a substantially transparent electrode; and the auxiliary electrode layer is a reflective electrode.

Optionally, the display substrate further comprises a pixel definition layer for defining a plurality of pixel apertures, inside each of which a respective one of the plurality of first electrodes and a respective one of the plurality of auxiliary electrodes are disposed.

Optionally, the display substrate comprises a plurality of vias extending through the insulating layer; and each individual one of the plurality of first electrodes is electrically connected to the pixel circuit through a respective one of the plurality of vias.

Optionally, the display substrate further comprises a second electrode layer; an organic light emitting layer in the plurality of pixel apertures and between the first electrode layer and the second electrode layer; and a plurality of thin film transistors configured to drive light emission of the display substrate; wherein each of the plurality of first electrodes is electrically connected to a drain electrode of a respective one of the plurality of thin film transistors.

Optionally, the auxiliary electrode layer is electrically connected to an auxiliary voltage terminal.

Optionally, the display substrate further comprises an auxiliary electrode signal line electrically connected to the auxiliary voltage terminal.

Optionally, the auxiliary voltage terminal is a common voltage terminal electrically connected to a common electrode signal line configured to provide a common voltage.

In another aspect, the present invention provides a display apparatus comprising the display substrate described herein or fabricated by the method describe herein.

In another aspect, the present invention provides a method of fabricating a display substrate having a plurality of subpixel areas, comprising forming a first electrode layer on a base substrate; forming an auxiliary electrode layer; forming an insulating layer; and forming a pixel circuit configured to drive light emission in a respective one of the plurality of subpixel areas; wherein forming the first electrode layer comprises forming a plurality of first electrodes respectively in the plurality of subpixel areas; the insulating layer is formed between the first electrode layer and the auxiliary electrode layer; the first electrode layer and the auxiliary electrode layer are formed to be spaced apart and insulated from each other by the insulating layer; the first electrode layer and the auxiliary electrode layer are formed so that an orthographic projection of each individual one of the plurality of first electrodes on the base substrate at least partially overlap with an orthographic projection of the auxiliary electrode layer on the base substrate; and each of the plurality of first electrodes is formed to be electrically connected to a pixel circuit.

Optionally, forming the auxiliary electrode layer comprises forming, a plurality of auxiliary electrodes; and wherein the auxiliary electrode layer and the first electrode layer are formed so that an orthographic projection of each individual one of the plurality of auxiliary electrodes on the base substrate at least partially overlaps with an orthographic projection of one or multiple of the plurality of first electrodes on the base substrate.

BRIEF DESCRIPTION OF THE. FIGURES

The following drawings are merely examples for illustrative purposes according to various disclosed embodiments and are not intended to limit the scope of the present invention.

DETAILED DESCRIPTION

The disclosure will now be described more specifically with reference to the following embodiments. It is to be noted that the following descriptions of some embodiments are presented herein for purpose of illustration and description only. It is intended to be exhaustive or to be limited to the precise form disclosed.

As the development of the display technology, the resolution of OLED display devices become higher. In general, the Micro OLED display devices adopt an extremely high PPI (Pixels Per Inch) which is greater than 3000 PPI. For example, the PPI of an OLED display device, whose size is 0.39 inch and whose resolution is 1024×768, can reach 3256 PPI. Under this circumstance, the OLED display device includes a plurality of subpixels. The distance between any two adjacent subpixels is approximately 0.85 μm, and the width of each individual one of the plurality of subpixels are approximately 4.35 μm. Therefore, there will be a parasitic capacitance $C_{Anode}$ between two anodes of any two adjacent subpixels of a plurality of subpixels. In some circumstance, one of any two adjacent subpixels of a plurality of subpixels is turned on and the other one of any two adjacent subpixels of a plurality of subpixels is turned off, but the other one of any two adjacent subpixels of a plurality of subpixels will be turned on by the coupling induction of the parasitic capacitance $C_{Anode}$, which causes crosstalk and reduces the display effect.

Accordingly, the present disclosure provides, infer Glia, a display substrate, a display apparatus, and a method of fabricating a display substrate that substantially obviate one or more of the problems due to limitations and disadvantages of the related art. In one aspect, the present disclosure provides a display substrate having a plurality of subpixel areas. In some embodiments, the display substrate includes a first electrode layer including a plurality of first electrodes respectively in the plurality of subpixel areas; an auxiliary electrode layer; and an insulating layer between the first electrode layer and the auxiliary electrode layer. The first electrode layer and the auxiliary electrode layer are spaced apart and insulated from each other by the insulating layer. An orthographic projection of each individual one of the plurality of first electrodes on the base substrate at least partially overlap with an orthographic projection of the auxiliary electrode layer on the base substrate. Each of the plurality of first electrodes is electrically connected to a pixel circuit configured to drive light emission in a respective one of the plurality of subpixel areas. Optionally, the auxiliary electrode layer is electrically connected to an auxiliary voltage terminal.

Figure 1A:
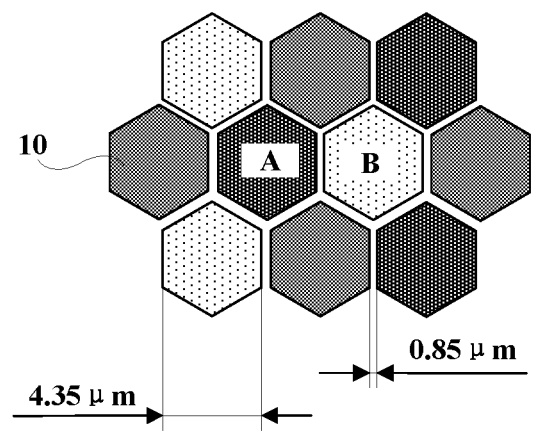
FIG. 1A is a schematic diagram of the structure of a plurality of subpixel areas in a display substrate in some embodiments according to the present disclosure.
Figure 1B:
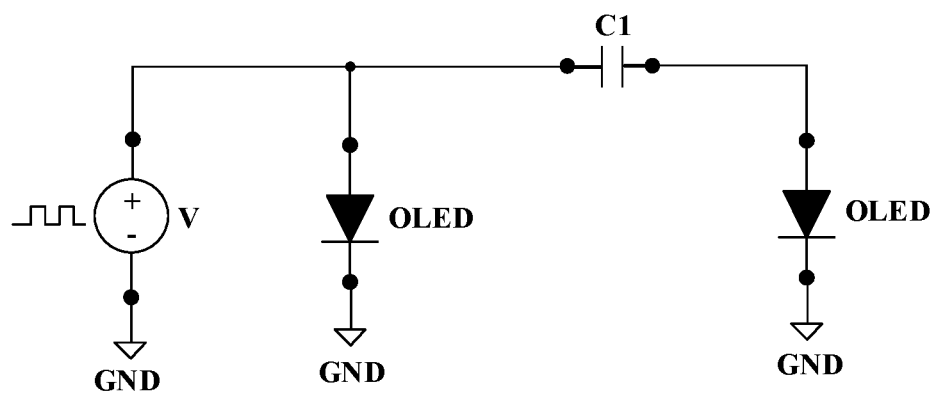
FIG. 1B is a schematic diagram of the structure of a partial pixel circuit of the display substrate in FIG. 1A.
Figure 1C:
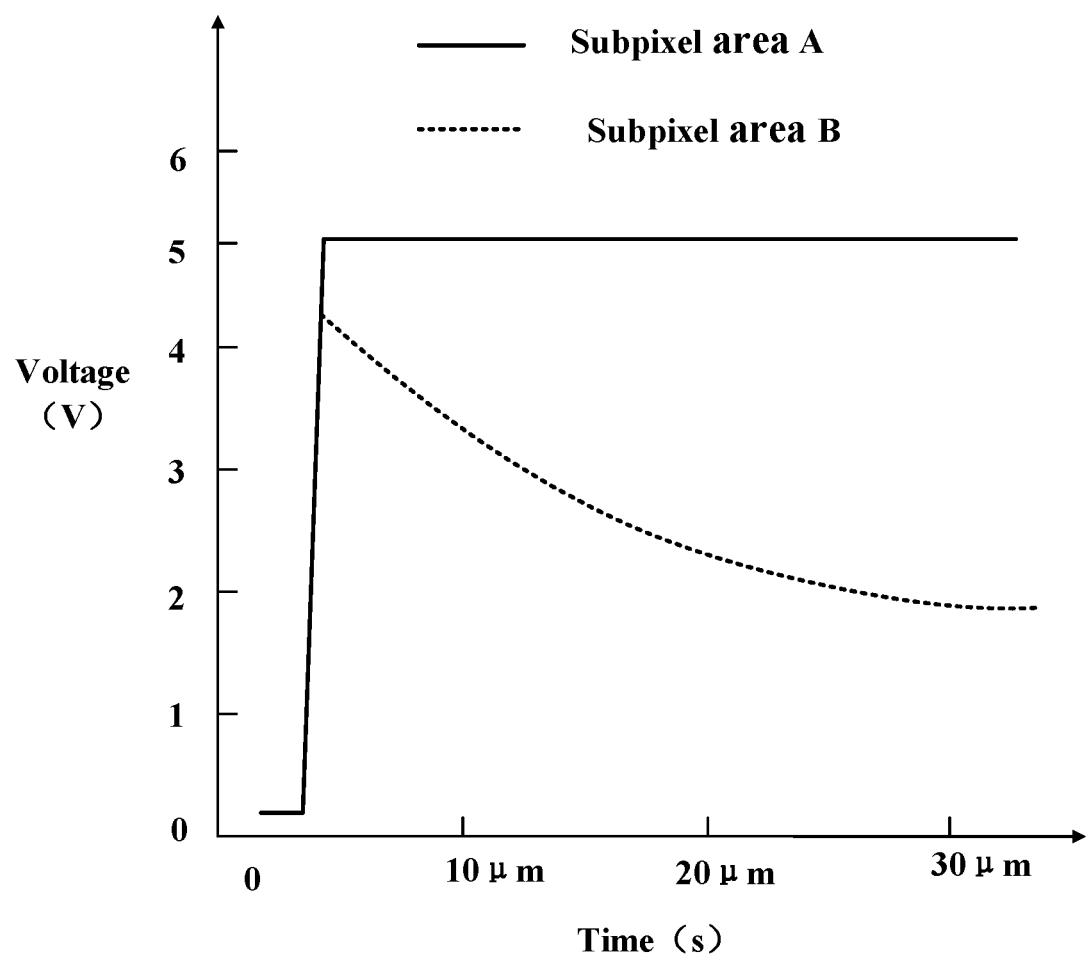
FIG. 1C illustrates illumination induced by coupling effects between two adjacent. subpixel areas.

FIG. 1A is a schematic diagram of the structure of a plurality of subpixel areas in a display substrate in some embodiments according to the present disclosure. FIG. 1B is a schematic diagram of the structure of a partial pixel circuit of the display substrate in FIG. 1A. FIG. 1C illustrates illumination induced by coupling effects between two adjacent subpixel areas. Referring to FIG. 1A, the display substrate in some embodiments includes a plurality of subpixel areas 10. The distance between any two adjacent subpixel areas (e.g. subpixel area A and subpixel area B) is approximately 0.85 μm, and the width of each individual one of the plurality of subpixel areas 10 is approximately 4.35 μm, Therefore, as shown in FIG. 1B, because the distance between any two adjacent subpixel areas is relatively small, a parasitic capacitance $C_{Anode}$ is generated between two anodes of subpixel area A and subpixel area B. In some embodiments, although subpixel area A is turned on and subpixel area B is turned off, the subpixel area B will be turned on by the coupling induction of the parasitic capacitance $C_{Anode}$. As shown in FIG. 1C, a voltage is applied on the subpixel OLED device of subpixel B, which generates crosstalk and reduces the display quality.

Figure 2:
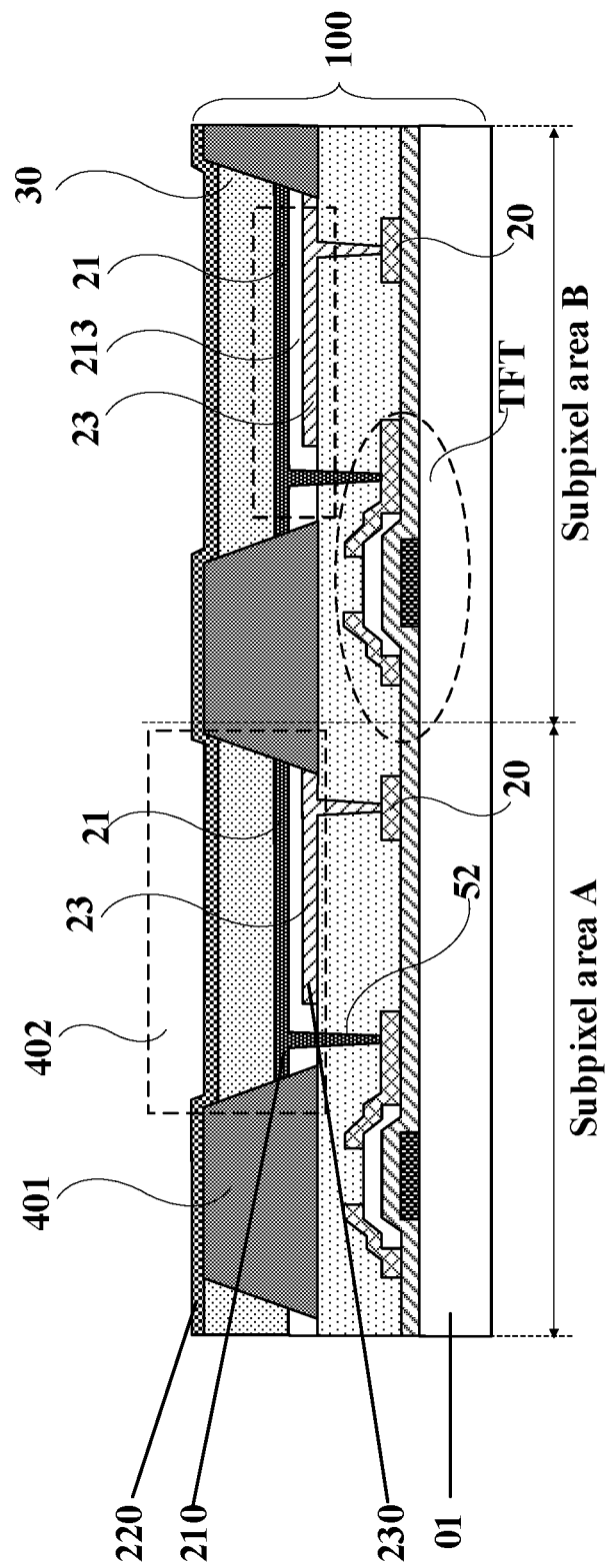
FIG. 2 is a schematic diagram of the structure of a display substrate according to some embodiments of the present disclosure.

FIG. 2 is a schematic diagram of the structure of a display substrate according to some embodiments of the present disclosure. Referring to FIG. 2, the display substrate is a thin film transistor array substrate 100 including a first electrode layer 210. The first electrode layer 210 includes a plurality of first electrodes 21 respectively in the plurality of subpixel areas, e.g. each individual one of the plurality of first electrodes 21 is in a respective one of the plurality of subpixel areas, and first electrodes in any two adjacent subpixel areas of the plurality of subpixel areas are spaced apart and insulated from each other.

In some embodiments, the display substrate includes an auxiliary electrode layer 230 and an insulating layer 213, the auxiliary electrode layer 230 is spaced apart from the first electrode layer 210 by the insulating layer 213. An orthographic projection of each individual one of the plurality of first electrodes 21 on a base substrate 01 at least partially overlaps with an orthographic projection of the auxiliary electrode layer 230 on the base substrate 01. Optionally, the auxiliary electrode layer 230 includes a plurality of auxiliary electrodes 23. An orthographic projection of each individual one of the plurality of auxiliary electrodes 23 on the base substrate 01 at least partially overlaps with an orthographic projection of one or multiple of the plurality of first electrodes 21 on the base substrate 01.

In some embodiments, the base substrate 01 is a transparent glass base substrate. Optionally, the base substrate 01 is a rigid substrate made of a transparent resin material. Optionally, the base substrate 01 is a flexible substrate made of a transparent resin material. Referring to FIG. 2, the display substrate further includes a plurality of thin film transistors TFT on the base substrate 01, therefore, thereby forming the thin film transistor array substrate 100. A pixel circuit in each of the plurality of subpixel areas may include multiple thin film transistors of the plurality of thin film transistors TFT.

Figure 3:
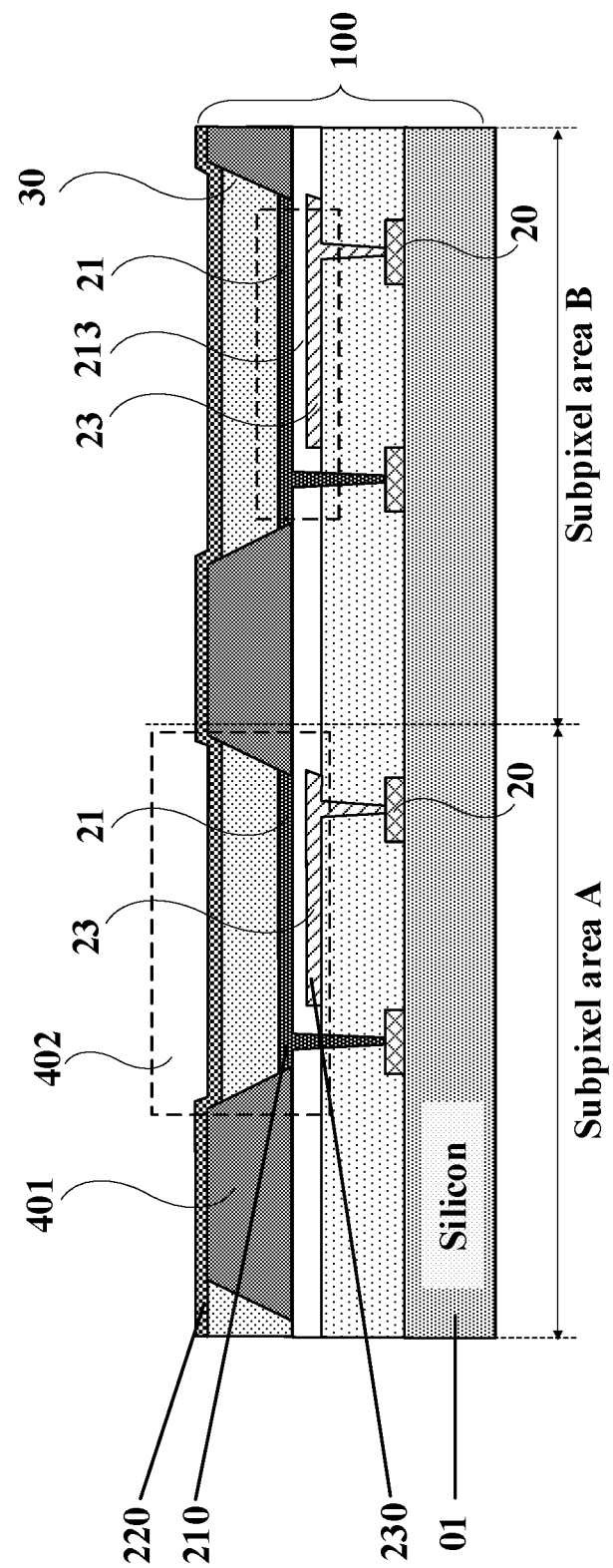
FIG. 3 is a schematic diagram of the structure of a display substrate according to some embodiments of the present disclosure.

FIG. 3 is a schematic diagram of the structure of a display substrate according to some embodiments of the present disclosure. Referring to FIG. 3, the base substrate 01 is made of silicon, such as silicon chips. A driving circuit can be formed on the silicon material of the base substrate 01 by patterning process. Optionally, the pixel circuit includes a driving circuit in each individual one of the plurality of subpixel areas. Because the base substrate 01 of the thin film transistor array substrate 100 is made of silicon material, the display substrate having the thin film transistor array substrate 100 can be used to form a silicon micro-display device.

In some embodiments, the material of the plurality of first electrodes 21 and material of the plurality of auxiliary electrodes 23 are both conductive materials. Therefore, when a driving voltage is applied to one of the plurality of first electrodes 21 and a common voltage is applied to a respective one of the plurality of auxiliary electrodes 23, a capacitance Cst is formed between the one of the plurality of first electrodes 21 and the respective one of the plurality of auxiliary electrodes 23. The one of the plurality of first electrodes 21 constitutes the first end of the capacitance Cst, and the respective one of the plurality of auxiliary electrodes 23 constitutes the second end of the capacitance Cst.

In some embodiments, in order to form the capacitance Cst, each individual one of the plurality of first electrodes 21 is electrically connected, to a pixel circuit configured to drive light emission in a respective one of the plurality of subpixel areas. Because each individual one of the plurality of first electrodes 21 in a respective one of the plurality of subpixel areas is spaced apart and insulated from any other first electrode of the plurality of first electrodes 21, each individual one of the plurality of first electrodes 21 can be separately applied with a driving voltage by the pixel circuit in a respective one of the plurality of subpixel areas based on the luminance level of each individual one of the plurality of the subpixel areas.

Figure 4:
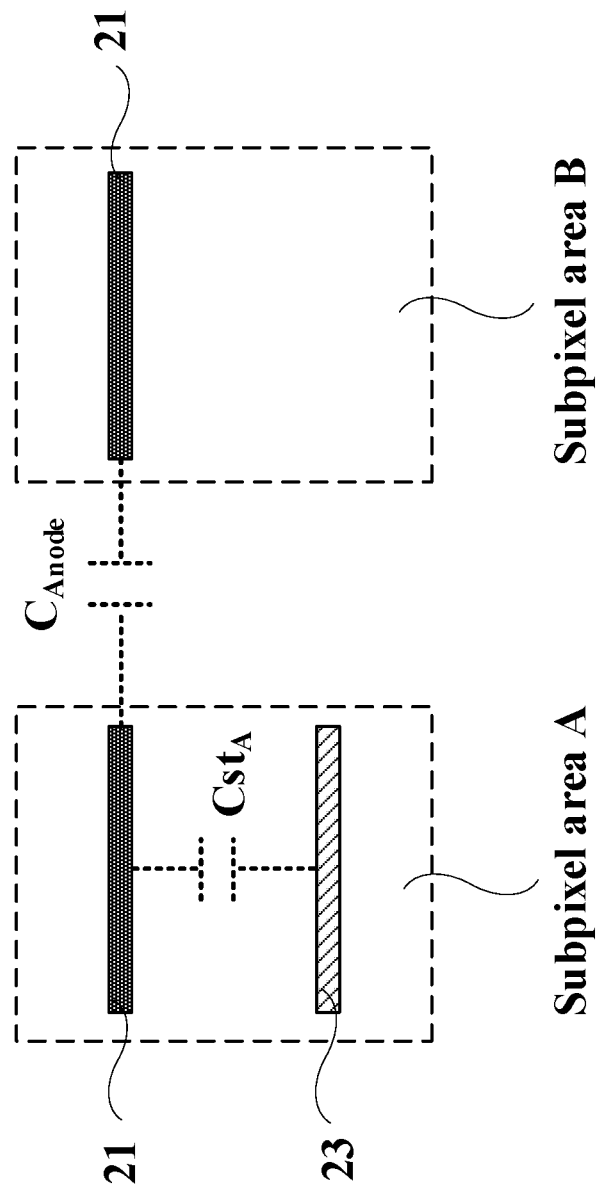
FIG. 4 illustrates a working principle of charge dispersion by an auxiliary capacitance according to some embodiments of the present disclosure.

FIG. 4 illustrates a working principle of charge dispersion by an auxiliary capacitance. Referring to FIG. 4, the distance between any two adjacent ones of the plurality of subpixel areas (e.g. subpixel area A and subpixel area B) is relatively small, therefore, a parasitic capacitance $C_{Anode}$ is generated between the two adjacent first electrodes of the plurality of first electrodes 21 respectively in two adjacent subpixel areas of the plurality of subpixel areas.

In some embodiments, the display substrate includes an auxiliary voltage terminal, and the each individual one of the plurality of auxiliary electrodes 23 is electrically connected to the auxiliary voltage terminal. Optionally, the display substrate includes a common electrode terminal Vcom configured to be provided with a common voltage, the auxiliary voltage terminal can be the common electrode terminal Vcom.

In some embodiments, referring to both. FIG. 2 and FIG. 3, in order to connect each individual one of the plurality of auxiliary electrodes 23 with the common electrode terminal Vcom, a plurality of signal lines 20 are disposed on the thin film transistor array substrate 100, a first end of each individual one of the plurality of signal lines 20 is connected to a respective one of the plurality of auxiliary electrodes 23, and a second end of each individual one of the plurality of signal lines 20 extends to the peripheral area of the display substrate and electrically connects to the common electrode terminal Vcom disposed in the peripheral area of the display substrate.

In some embodiments, the thin film transistor array substrate 100 includes a plurality of thin film transistors TFT. Referring to Fla 2, the plurality of signal lines 20, and the source electrodes and the drain electrodes of the plurality of thin film transistors TFT in the thin film transistor array substrate 100 are in a same layer and are formed using a same material. Optionally, the source electrodes and the drain electrodes of the plurality of thin film transistors TFT and the plurality of the signal lines 20 can be formed in a single patterning process, e.g., using a same mask plate.

Figure 5:
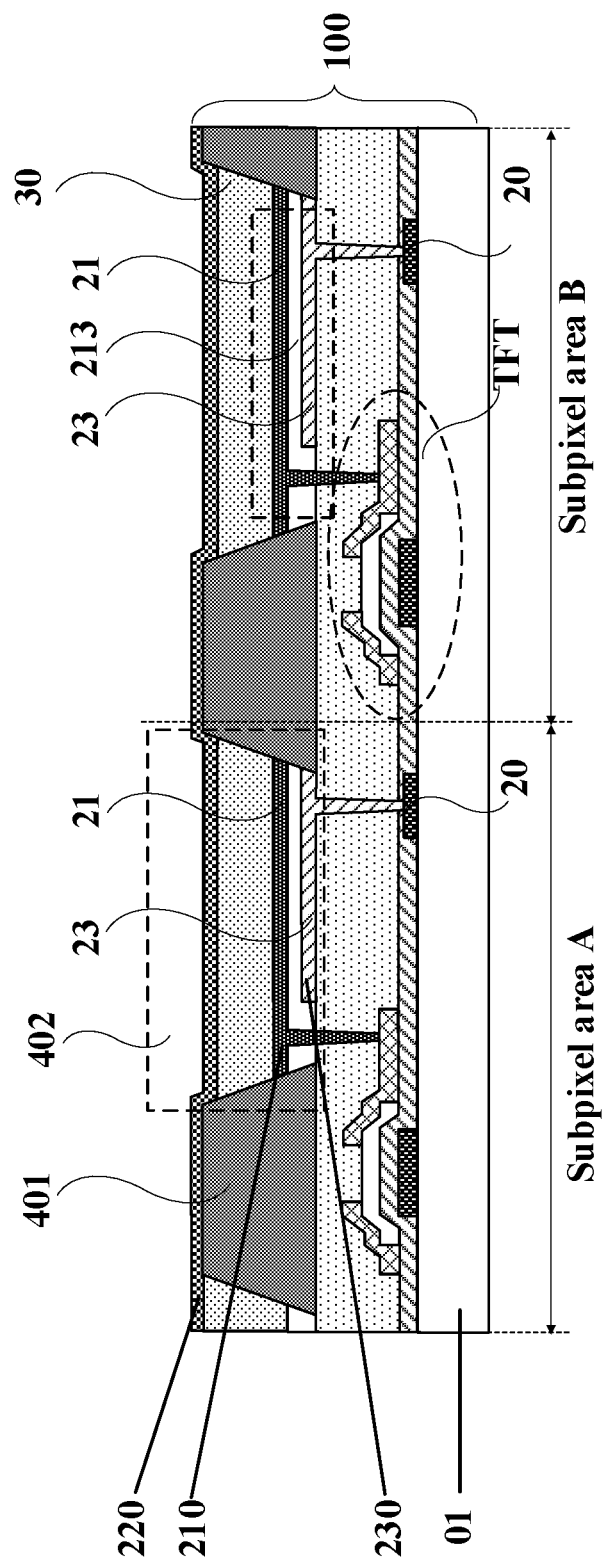
FIG. 5 is a schematic diagram of the structure of a display substrate according to some embodiments of the present disclosure.

FIG. 5 is a schematic diagram of the structure of a display substrate according to some embodiments of the present disclosure. Referring to FIG. 5, the plurality of signal lines 20 and gate electrodes of the plurality of thin film transistors TFT in the thin film transistor array substrate 100 are in a same layer and are formed using a same material. Optionally, the gate electrodes of the plurality of thin film transistors TFT and the plurality of the signal lines 20 can be formed in a single patterning process, e.g., using a same mask plate.

In some embodiments, in order to optimize the wiring space and neatly arrange the wirings in the display area of the display substrate, each individual one of the plurality of signal lines are parallel to the gate lines. Optionally, each individual one of the plurality of signal lines are parallel to the data lines.

In some embodiments, the patterning process includes a photolithography process. Optionally, the patterning process includes a photolithography process and an etching process. Optionally, the patterning process includes other processes for thrilling a predetermined pattern such as printing, inkjet, etc. In some embodiments, the photolithography process includes forming a photoresist layer, and exposing and developing the photoresist layer using a mask plate.

In some embodiments, the one-step patterning process includes formula various exposed regions by a one-step masking and exposing process, and forming the predetermined pattern by a removing process such as etching or fishing the various exposed region.

In some embodiments, each individual one of the plurality of first electrodes 21 forms the first end of the respective one of the plurality of auxiliary capacitance Cst, and a respective one of the plurality of auxiliary electrodes 23 forms the second end of the respective one of the plurality of auxiliary capacitances Cst. Referring to FIG. 4, the pixel circuit in one of the plurality of subpixel areas (e.g. Pixel circuit A) includes one of the plurality of first electrodes 21 and a respective one of the plurality of auxiliary electrodes 23 forming an auxiliary capacitance $Cst_A$. For two adjacent subpixel areas of the plurality of subpixel areas (e.g. subpixel area A and subpixel area B), the auxiliary capacitance $Cst_A$, in the pixel circuit of subpixel area A can disperse part of the charges that could have been charged on the parasitic capacitance $C_{Anode}$ formed between one of the plurality of first electrodes 21 in subpixel area A and one of the plurality of first electrodes 21 in subpixel area B.

Figure 6:
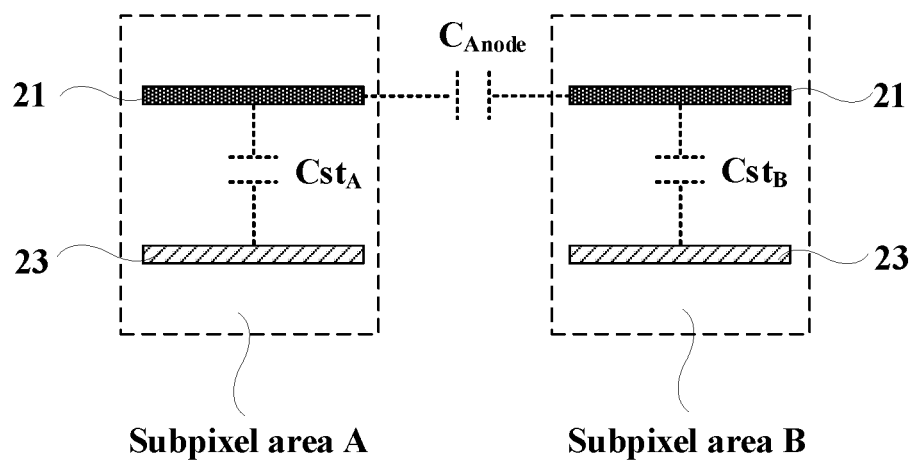
FIG. 6 illustrates a working principle of charge dispersion by an auxiliary capacitance according to some embodiments of the present disclosure.

FIG. 6 illustrates a working principle of charge dispersion by an auxiliary capacitance according to some embodiments of the present disclosure. Referring to FIG. 6, each of the two adjacent subpixel areas of the plurality of subpixel areas (e.g. subpixel area A and subpixel area. B) includes a combination of one of the plurality of first electrodes 21 and a respective one of the plurality of the auxiliary electrodes 23. The auxiliary capacitance $Cst_A$ in the pixel circuit of subpixel area A and the auxiliary capacitance $Cst_B$ in the pixel circuit of subpixel area B can disperse the charges that could have been charged on the parasitic capacitance $C_{Anode}$ formed between the one of the first electrodes 21 in subpixel area A and one of the first electrodes 21 in subpixel area B.

In one example, the subpixel area A is turned on and the subpixel area B is turned off. A driving voltage is applied to one of the plurality of first electrodes 21 in subpixel area A, and no voltage is applied to one of the plurality of first electrodes 21 in subpixel area B. Referring to FIG. 4, although there is a parasitic capacitance $C_{Anode}$ between one of the plurality of first electrodes 21 in subpixel area A and one of the plurality of first electrodes 21 in subpixel area B, the charges that could have been charged on the parasitic capacitance $C_{Anode}$ are at least partially dispersed by the auxiliary capacitance $Cst_A$. Referring to FIG. 6, although there is a parasitic capacitance $C_{Anode}$ between one of the plurality of first electrodes 21 in subpixel area A and one of the plurality of first electrodes 21 in subpixel area 13, the charges that could have been charged on the parasitic capacitance are at least partially dispersed by the auxiliary capacitance $Cst_A$ and the auxiliary capacitance $Cst_B$. As a result, the one of the plurality of first electrodes 21 in subpixel area 13 will not have enough charges to drive the OLED device in subpixel area B by the coupling induction of the parasitic capacitance $C_{Anode}$. The OLED device in subpixel area B will not be illuminated by the coupling induction of the parasitic capacitance $C_{Anode}$. In the present display substrate, the probability of illumination induced by the parasitic capacitance $C_{Anode}$ is significantly reduced. Display quality can be enhanced by preventing the crosstalk phenomenon.

Figure 7:
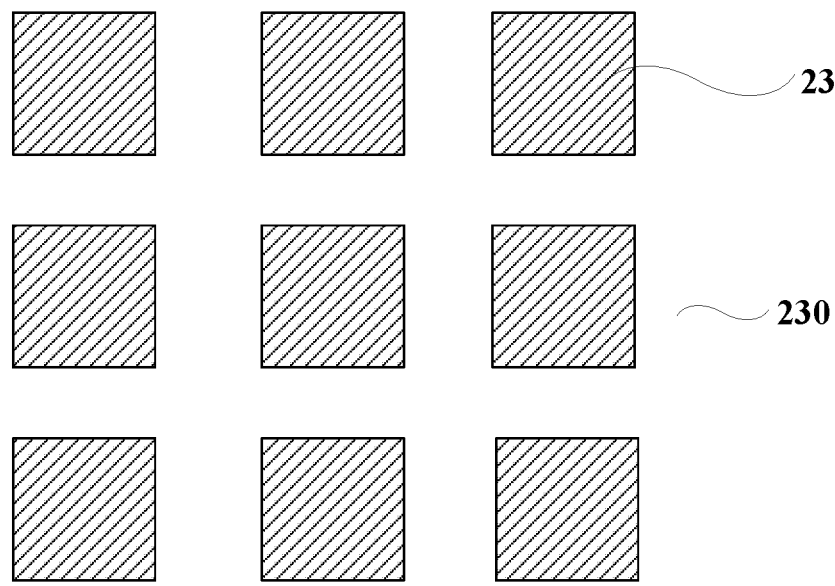
FIG. 7 is a schematic diagram of the structure of a plurality of auxiliary electrodes according to some embodiments of the present disclosure.

FIG. 7 is a schematic diagram of the structure of a plurality of auxiliary electrodes according to some embodiments of the present disclosure. Referring to FIG. 7, the display substrate includes an auxiliary electrode layer 230, and the auxiliary electrode layer 230 includes the plurality of auxiliary electrodes 23, any two adjacent auxiliary electrodes of the plurality of auxiliary electrodes 23 are spaced apart from each other by insulating material.

Figure 8:
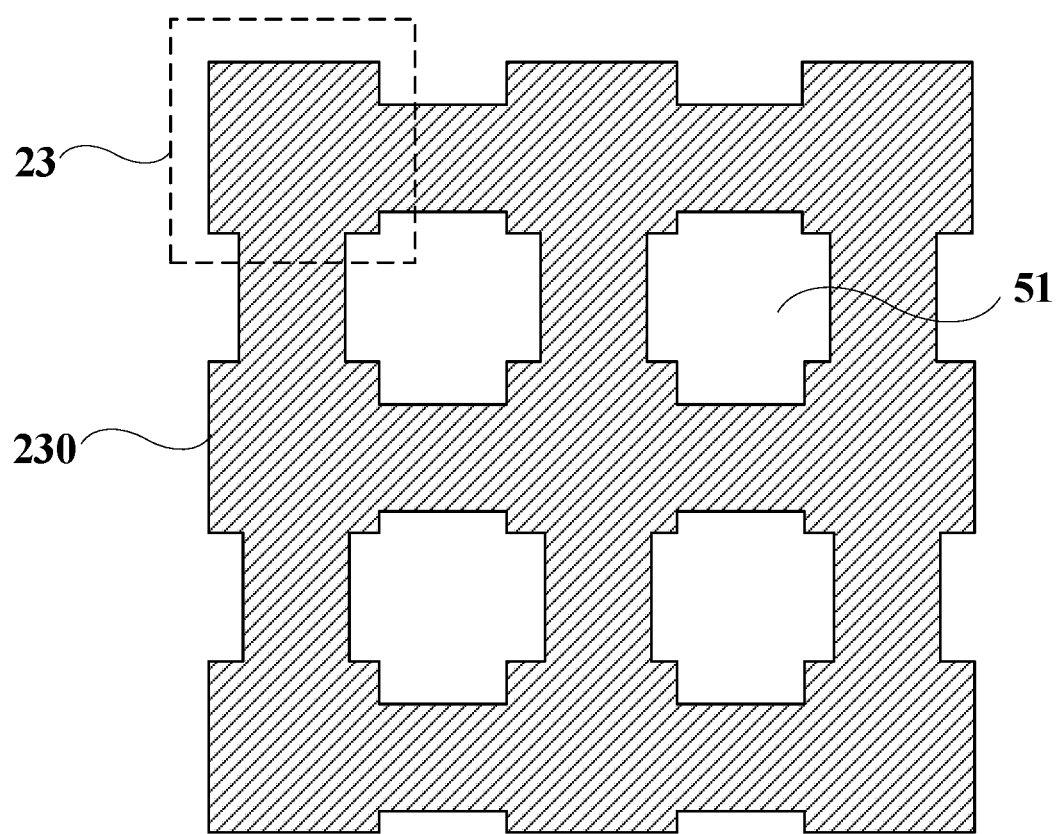
FIG. 8 is a schematic diagram of the structure of a plurality of auxiliary electrodes according to same embodiments of the present disclosure.

FIG. 8 is a schematic diagram of the structure of a plurality of auxiliary electrodes according to same embodiments of the present disclosure, Referring to FIG. 8, a display substrate includes the auxiliary electrode layer 230, and the auxiliary electrode layer 230 is an integral electrode layer. The auxiliary electrode layer 230 includes a plurality of auxiliary electrodes 23 interconnect with each other, thereby forming the integral electrode layer. Optionally, the auxiliary electrode layer 230 can be an integral thin film layer on a side of the thin film transistor army substrate facing the plurality of first electrodes.

In some embodiments, the auxiliary electrode layer 230 is between the thin film transistor array substrate and the first electrode layer 210. Referring to FIG. 8, the display substrate in some embodiments includes a plurality of first vias 51 extending through the auxiliary electrode layer 230. Optionally, each individual one of the plurality of first electrodes is electrically connected to the pixel circuit through a respective one of the plurality of first vias 51.

The plurality of auxiliary electrode 23 may have various appropriate shapes. Optionally, each individual one of the plurality of auxiliary electrode 23 has a hexagonal shape. Optionally, each individual one of the plurality of auxiliary electrode 23 has a rectangular shape. Similarly, the plurality of first electrodes 21 may have various appropriate shapes. Optionally, each individual one of the plurality of first electrodes 21 has a hexagonal shape. Optionally, each individual one of the plurality of first electrodes 21 has a rectangular shape.

Figure 11:
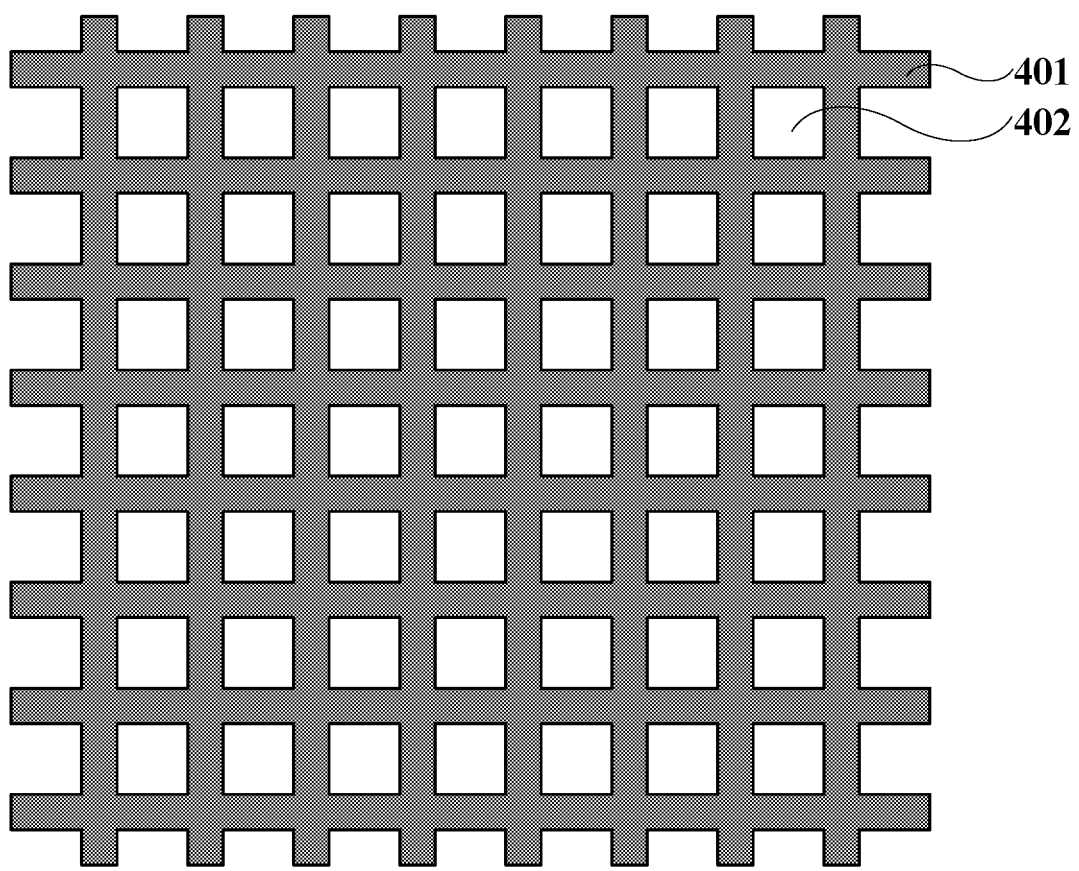
FIG. 11 is a schematic diagram of the structure of a pixel definition layer according to some embodiments of the present disclosure.

Referring to FIG. 2, the thin film transistor array substrate 100 includes a pixel definition layer 401. The pixel definition layer defined a plurality of pixel apertures 402, FIG. 11 is a schematic diagram of the structure of a pixel definition layer according to some embodiments of the present disclosure. Referring to FIG. 11, each individual one of the plurality of first vias 51 has a rectangular shape. Optionally, each individual one of the plurality of first vias 51 has a hexagonal shape.

In some embodiments, at least one of the plurality of first electrodes 21 is disposed in a respective one of the plurality of pixel apertures 402. Referring to FIG. 2, the display substrate in some embodiments includes a plurality of second vias 52 extending through the insulating layer 213, each of the plurality of second vias 52 is at a position corresponding to a respective one of the plurality of pixel apertures 402. Each individual one of the plurality of first electrodes 21 is electrically connected to the pixel circuit through a respective one of the plurality of second vias 52.

In some embodiments, an orthographic projection of each individual one of the plurality of auxiliary electrodes 23 on the base substrate 01 at least partially overlap with an orthographic projection of a respective one of the plurality of first electrodes 21 on the base substrate 01, For example, each individual one of the plurality of first electrodes 21 corresponds to a respective one of the plurality of auxiliary electrodes 23.

Optionally, as shown in FIG. 7, any two adjacent ones of the plurality of auxiliary electrodes 23 are spaced apart from each other by insulating material. Referring to FIG. 2, the auxiliary capacitances Cst between one of the plurality of first electrodes 21 and a respective one of the plurality of auxiliary electrodes 23 is in a region corresponding to a respective one of the plurality of pixel apertures 402.

Optionally, as shown in FIG. 8, the auxiliary electrode layer 230 is an integral electrode layer. Referring to FIG. 3, the auxiliary capacitances Cst is in a region corresponding to a respective one of the plurality of pixel apertures 402. Each individual one of the plurality of auxiliary electrodes 23 is outside the respective one of the plurality of pixel apertures 402, e.g., underneath the respective one of the plurality of pixel apertures 402.

Figure 9:
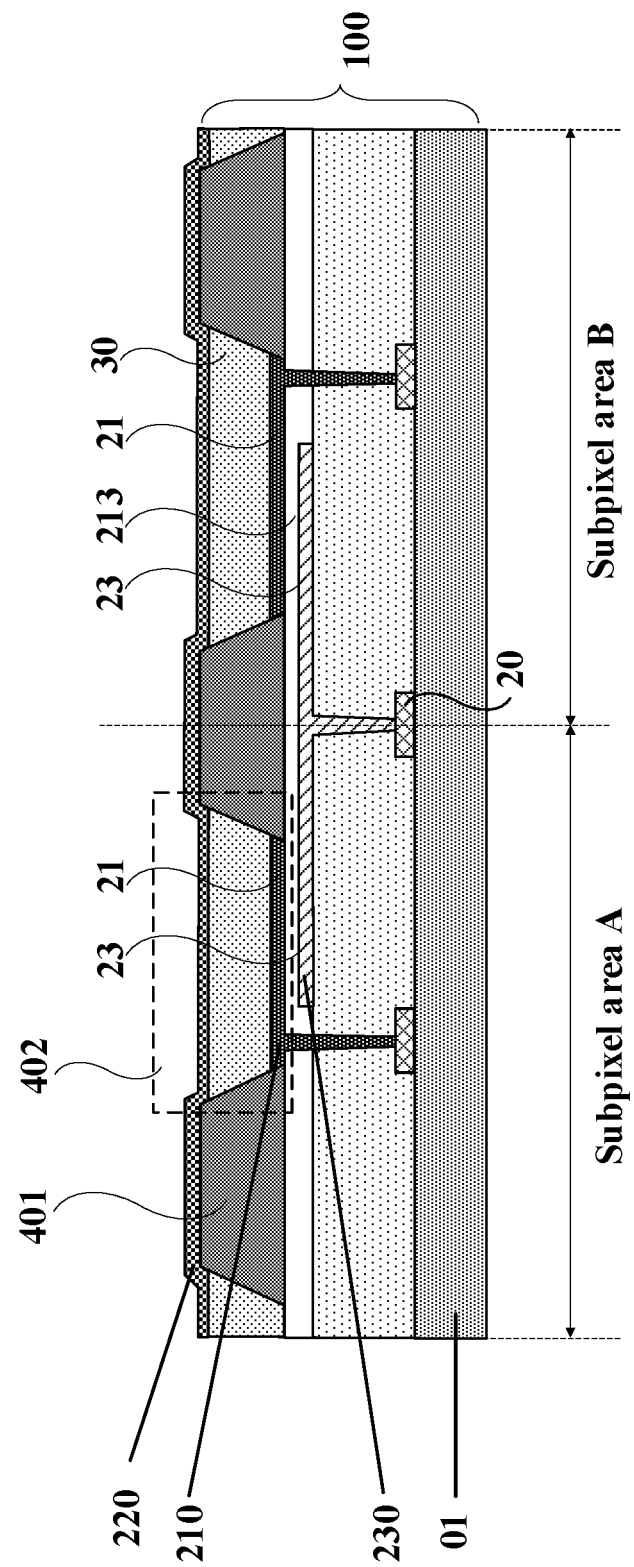
FIG. 9 is a schematic diagram of the structure of a display substrate according to some embodiments of the present disclosure.

FIG. 9 is a schematic diagram of the structure of a display substrate according to some embodiments of the present disclosure. Referring to FIG. 9, the display substrate includes a plurality of auxiliary electrodes 23. In some embodiments, an orthographic projection of two adjacent first electrodes of the plurality of first electrodes 21 respectively in two adjacent subpixel areas of the plurality of subpixel areas (e.g. subpixel area A and subpixel area B) on the base substrate 01 at least partially overlaps with an orthographic projection of a same individual one of the plurality of auxiliary electrodes 23 on the base substrate 01. For example, an orthographic projection of the one of the plurality of first electrode 21 of subpixel area A on the base substrate 01 partially overlaps with an orthographic projection of one of the plurality of auxiliary electrodes 23 on the base substrate 01, and an orthographic projection of the one of the plurality of the first electrode 21 of subpixel area B on the base substrate 01 partially overlaps with an orthographic projection of the same one of the plurality of auxiliary electrodes 23 on the base substrate 01. Therefore, the same one of the plurality of auxiliary electrodes 23 and the respective one of the plurality of the first electrode 21 in subpixel area A form an auxiliary capacitance $Cst_A$, and the same one of the plurality of auxiliary electrode 23 and the respective one of the plurality of the first electrode 21 in subpixel area B forms an auxiliary capacitance $Cst_B$.

Optionally, as shown in FIG. 7, any two adjacent ones of the plurality of auxiliary electrodes 23 are spaced apart from each other by insulating material, this arrangement of the plurality of auxiliary electrodes 23 is suitable for making the display substrate of FIG. 9. Optionally, as shown in FIG. 8, the auxiliary electrode layer 230 is an integral electrode layer, this arrangement of the plurality of auxiliary electrodes 23 is also suitable for making the display substrate of FIG. 9.

As compared to the embodiment in which the plurality of auxiliary electrodes 23 and the plurality of subpixel areas have a one-to-one correspondence relationship, each of the plurality of auxiliary electrodes 23 in the display substrate in FIG. 9 can be made to have a greater size, and the display substrate can have a smaller number of the plurality of auxiliary electrodes 23. Optionally, when the masking and exposing process is adopted to fabricate the plurality of the auxiliary electrodes 23, the display substrate in FIG. 9 demands a relatively lower accuracy and precision requirement, resulting in a lower fabrication cost. Moreover, because a total number of the plurality of the auxiliary electrodes 23 is reduced, a total number of the plurality of the signal lines respectively connected to the plurality of the auxiliary electrodes 23 can also be reduced, thereby reducing the light shielding area in the display substrate and improving the aperture ratio of the display substrate.

Figure 10:
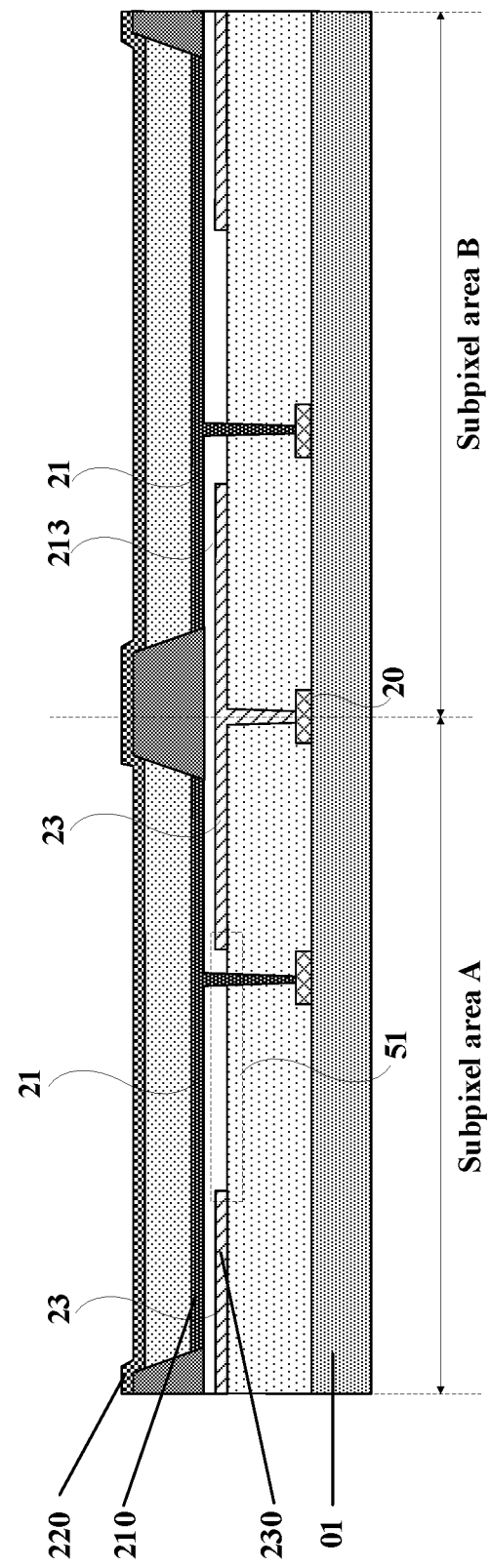
FIG. 10 is a schematic diagram of the structure of a display substrate according to some embodiments of the present disclosure.

FIG. 10 is a schematic diagram of the structure of a display substrate according to some embodiments of the present disclosure. Referring to FIG. 10, an orthographic projection of two adjacent auxiliary electrodes of the plurality of auxiliary electrodes 23 on the base substrate 01 at least partially overlaps with an orthographic projection of a same individual one of the plurality of first electrodes 21 on the base substrate 01; and an orthographic projection of two adjacent first electrodes of the plurality of first electrodes 21 respectively in two adjacent subpixel areas of the plurality of subpixel areas (e.g. subpixel area A and subpixel area B) on the base substrate 01 at least partially overlaps with an orthographic projection of a same individual one of the plurality of auxiliary electrodes 23 on the base substrate 01. For example, an orthographic projection of two adjacent auxiliary electrodes of the plurality of auxiliary electrodes 23 on the bases substrate 01 at least partially overlaps with an orthographic projection of a same individual one of the plurality of first electrodes 21 in subpixel area A.

Optionally, as shown in FIG. 7, any two adjacent ones of the plurality of auxiliary electrodes 23 are spaced apart from each other by insulating material, this arrangement of the plurality of auxiliary electrodes 23 is suitable for making, the display substrate in FIG. 10. Optionally, as shown in FIG. 8, the auxiliary electrode layer 230 is an integral electrode layer, this arrangement of the plurality of auxiliary electrodes 23 is also suitable for nuking, the display substrate in FIG. 10. Referring to FIG. 8, the display substrate in some embodiments includes a plurality of first vias 51 extending through the auxiliary electrode layer 230, and each individual one of the plurality of first electrodes is electrically connected to the pixel circuit through a respective one of the plurality of first vias 51.

Referring to FIG. 2, the display substrate further includes a second electrode layer 220 and an organic functional layer 30 in the plurality of pixel apertures 402 and between the first electrode layer 210 and the second electrode layer 220.

Optionally, the organic functional layer 30 includes a hole injection layer, a hole transport layer, an organic light emitting layer, an electron transport layer, and an electron injection layer, etc. Optionally, each layer in the organic functional layer 30 can be formed by evaporation process or inkjet printing process.

Optionally, for color display, the colors of the light emitted from the organic functional layer 30 in any three or more adjacent pixel apertures of a plurality of pixel apertures 402 are different from each other. For example, the organic functional layer 30 in any three or more adjacent pixel apertures of a plurality of pixel apertures 402 respectively emit red light, green light and blue light.

Figure 12A:
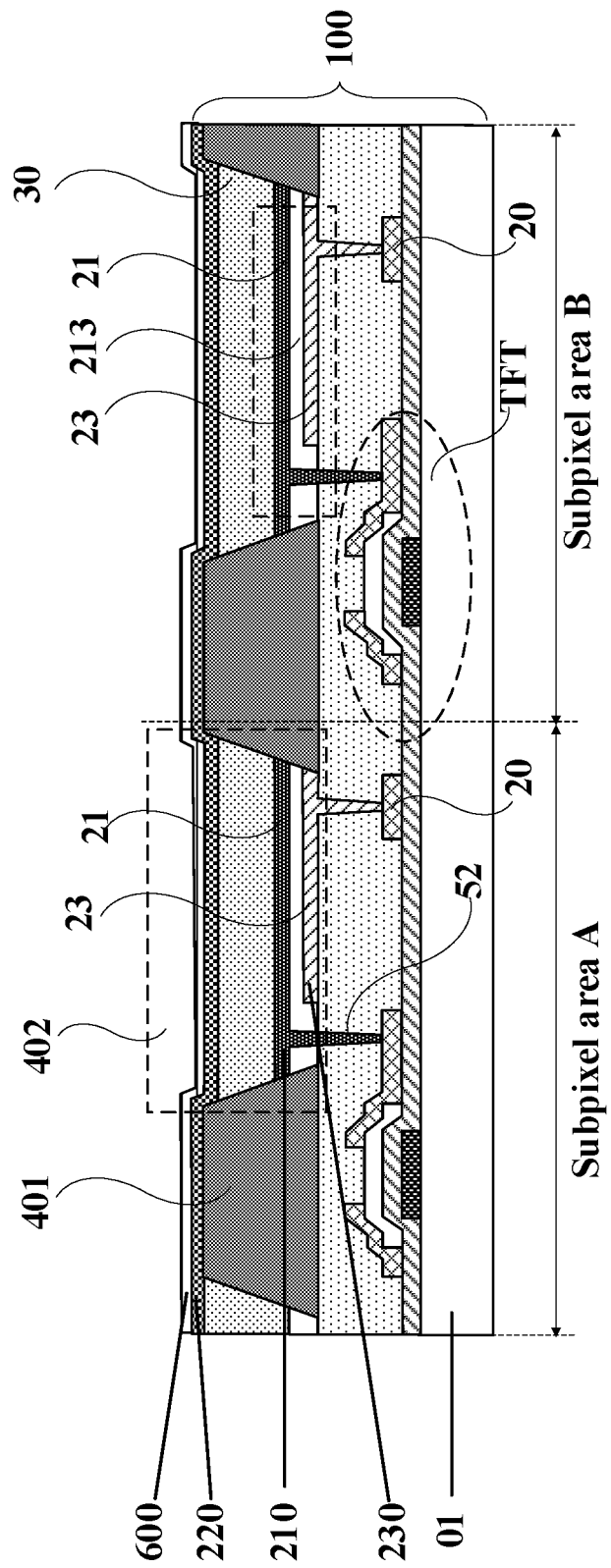
FIG. 12A is a schematic diagram of the structure of a display substrate according to some embodiments of the present disclosure.
Figure 12B:
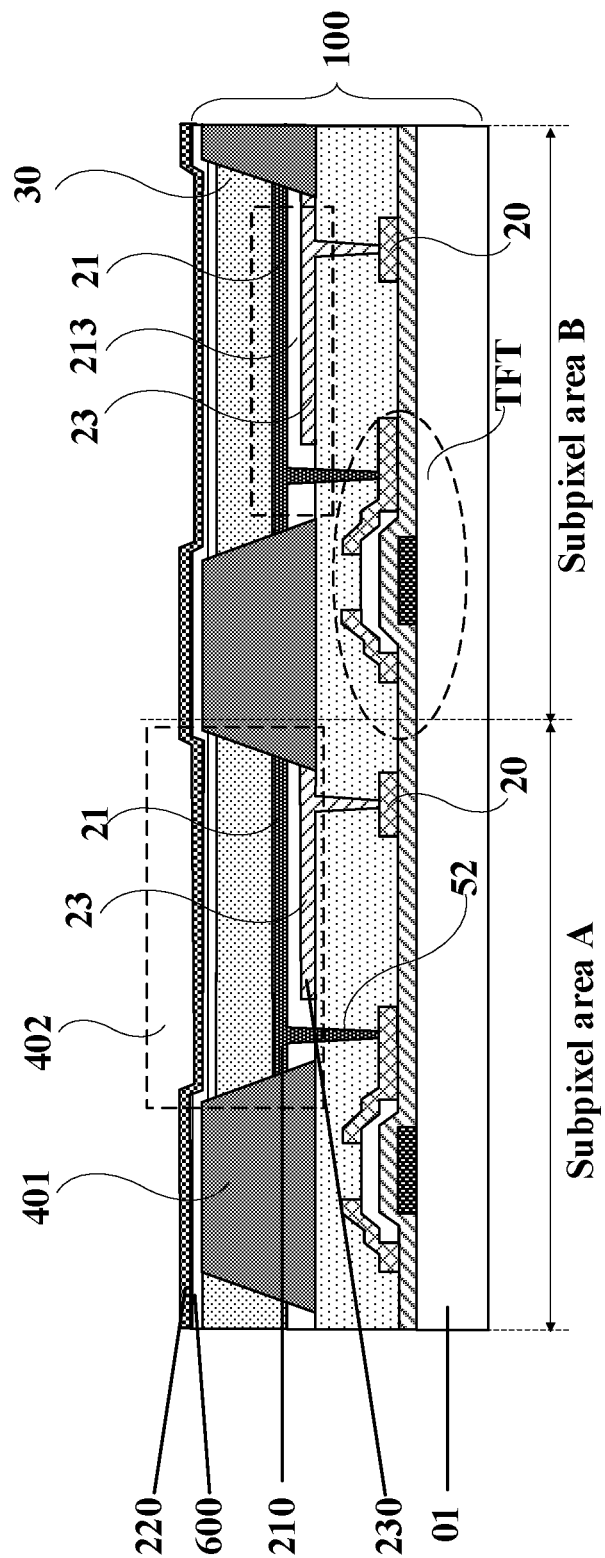
FIG. 12B is a schematic diagram of the structure of a display substrate according to some embodiments of the present disclosure.

FIG. 12A and FIG. 12B are schematic diagrams of the structure of a display substrate according to some embodiments of the present disclosure. Referring to FIG. 12A, the color of the light emitting from the organic functional layer 30 in any one of a plurality of pixel apertures 402 is the same and is white color. For color display, the display substrate further includes a color filter layer 600 on a side of the organic functional layer 30 facing away the base substrate 01. Optionally, referring to FIG. 12A, the color filter layer is disposed on a side of the second electrode layer 220 facing away the base substrate 01, Optionally, referring to FIG. 12B, the color filter layer is between the organic functional layer 30 and the second electrode layer 220.

Optionally, the color filter includes a plurality of color filter units. Each individual one of the plurality of color filter units is corresponding to a respective one of the plurality of subpixel areas. Any three or more adjacent ones of color filter units have different color. For example, there can be red color filter unit, blue color filter unit and green color filter unit.

Referring to both FIG. 2 and FIG. 3, in order to space apart and insulate the first electrode layer 210 from the auxiliary electrode layer 230, the insulating layer 213 is disposed between the first electrode layer 210 and the auxiliary electrode layer 230.

Referring to FIG. 2, each individual one of the plurality of first electrodes 21 corresponds to a respective one of the plurality of auxiliary electrodes 23 in a respective one of the plurality of pixel apertures 402. The insulating layer 213 between the first electrode layer 210 and the auxiliary electrode layer 230 is also in the respective one of the plurality of pixel apertures 402, e.g., the insulating layer 213 is inside the respective one of the plurality of pixel apertures 402.

Referring to FIG. 3, FIG. 9 and FIG. 10, the plurality of auxiliary electrodes 23 are not disposed inside the plurality of pixel apertures, instead, the insulating layer 213 is disposed on a side of the pixel definition layer 401 and the first electrode layer 210 facing the base substrate 01. Optionally, the insulating layer 213 is made of one or a combination of silicon dioxide and silicon nitride.

Optionally, the thicknesses of the insulating layer 213 in any three or more adjacent subpixel areas of a plurality of subpixel areas are different. For color display, the thickness of the insulating layer 213 can be adjusted, so that the thickness of the microcavity of the OLED device can be adjusted. Microcavities corresponding to subpixels of different colors respectively correspond to different thicknesses of the insulating layer 213 respectively in the subpixels of different colors. For example, the light, such as red light, green light or blue light, emitting from the plurality of subpixel areas can be separately enhanced to improve the light emitting rate of the plurality of subpixel areas.

Optionally, the display substrate is a top organic light-emitting OLED display substrate, the material of the second electrode layer 220 (as well as the material of the first electrode layer 210) may be a conductive material with a high transmission rate which in general is more than 80%, e.g. approximately 80% to approximately 85%, approximately 85% to approximately 90%, approximately 90% to approximately 95%, and approximately 95% to approximately 100%. Optionally, the first electrode layer 210 is a substantially transparent electrode. Optionally, the second electrode layer 220 is a substantially transparent electrode.

Various appropriate conductive materials and various appropriate fabricating methods may be used to make the second electrode layer 220 and the first electrode layer 210, For example, a transparent conductive material may be deposited on the substrate by a plasma-enhanced chemical vapor deposition (PECVD) process, Examples of appropriate transparent conductive materials include, but are not limited to, various transparent metallic electrode materials, transparent metal oxide electrode materials and transparent nano-carbon tubes. Examples of transparent metallic electrode materials include silver and magnesium/silver alloy or laminate. Examples of transparent metal oxide materials include, but are not limited to, indium tin oxide, indium zinc oxide, indium gallium oxide, and indium gallium zinc oxide.

Various appropriate conductive materials and various appropriate fabricating methods may be used to make auxiliary electrode layer 230. For example, a conductive material may be deposited on the substrate by a plasma-enhanced chemical vapor deposition (PECVD) process. Examples of appropriate conductive materials include, but are not limited to, a metal material such as molybdenum, aluminum, copper, silver, chromium, neodymium, nickel, manganese, titanium, tantalum, and tungsten. The light emitted from the organic functional layer 30 can be reflected by the auxiliary electrode layer 230 to improve the light emitting rate of the plurality of subpixel areas.

Optionally, the first electrode layer 210 is the anode of the OLED device. Optionally, the second electrode layer 220 is the cathode of the OLED device.

Figure 13:
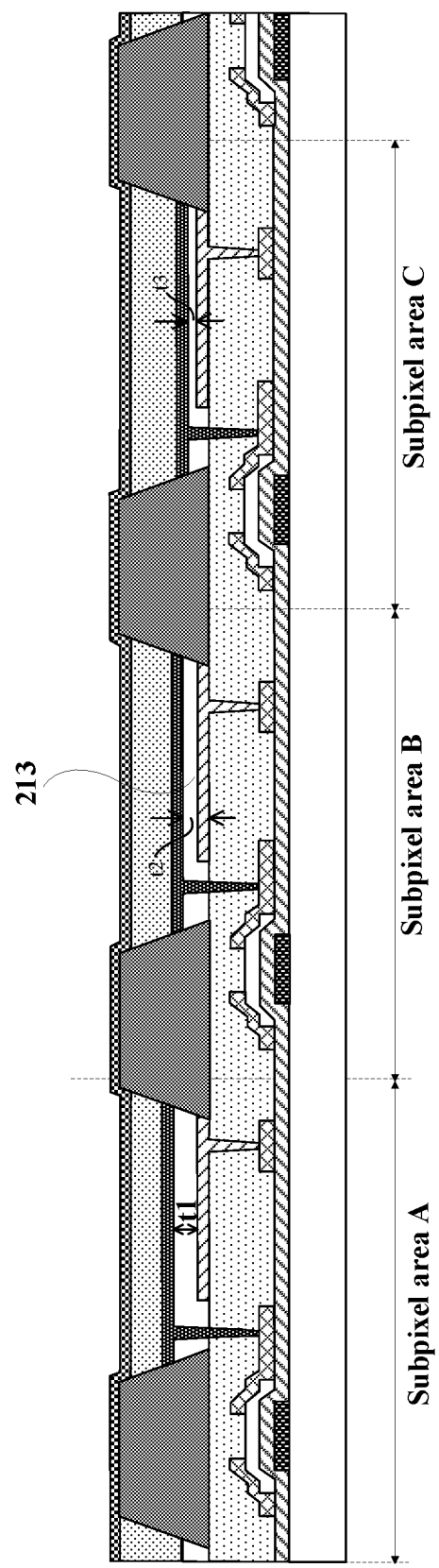
FIG. 13 is a schematic diagram of the structure of a display substrate according to some embodiments of the present disclosure.

Optionally, a microcavity is formed between the first electrode layer 210 and the auxiliary electrode 213. Optionally, the first electrode layer 210 is a substantially transparent electrode, and the auxiliary electrode 213 is a reflective electrode. As used herein, the term "substantially transparent" means at least 60 percent (e.g., at least 70 percent, at least 80 percent, at least 90 percent, and at least 95 percent) of light in the visible wavelength range transmitted therethrough. As used herein, the term "reflective" means at least 60 percent (e.g., at least 70 percent, at least 80 percent, at least 90 percent, and at least 95 percent) of light in the visible wavelength range is reflected. Optionally, the thicknesses of the insulating layer 213 in any three or more adjacent subpixel areas of a plurality of subpixel areas are different, so that optical paths in respective microcavities have different lengths. FIG. 13 is a schematic diagram of the structure of a display substrate according to some embodiments of the present disclosure. Referring to FIG. 13, in some embodiments, thicknesses of the insulating layer (t1, t2, and t3) respectively in three adjacent subpixel areas (subpixel area A, subpixel area B, and subpixel area C) are different from each other.

In another aspect, the present disclosure provides a method of fabricating a display substrate. In some embodiments, the method includes forming a first electrode layer; forming an auxiliary electrode layer; forming an insulating layer; and forming a pixel circuit configured to drive light emission in a respective one of the plurality of subpixel areas. Optionally, the step of forming the first electrode layer includes forming a plurality of first electrodes respectively in the plurality of subpixel areas. Optionally, the insulating layer is formed between the first electrode layer and the auxiliary electrode layer. Optionally, the first electrode layer and the auxiliary electrode layer are formed to be spaced apart and insulated from each other by the insulating layer. Optionally, the first electrode layer and the auxiliary electrode layer are formed so that an orthographic projection of each individual one of the plurality of first electrodes on the base substrate at least partially overlap with an orthographic projection of the auxiliary electrode layer on the base substrate. Optionally, each of the plurality of first electrodes is formed to be electrically connected to a pixel circuit. Optionally, the auxiliary electrode layer is formed to be electrically connected to an auxiliary voltage terminal.

In some embodiments, the step of formula the auxiliary electrode layer comprises forming a plurality of auxiliary electrodes. Optionally, the auxiliary electrode layer and the first electrode layer are formed so that an orthographic projection of each individual one of the plurality of auxiliary electrodes on the base substrate at least partially overlaps with an orthographic projection of one or multiple of the plurality of first electrodes on the base substrate. Optionally, the auxiliary electrode layer and the first electrode layer are formed so that the orthographic projection of each individual one of the plurality of auxiliary electrodes on the base substrate at least partially overlaps with a respective one of the plurality of first electrodes on the base substrate. Optionally, the auxiliary electrode layer and the first electrode layer are formed so that an orthographic projection of each of two adjacent first electrodes of the plurality of first electrodes respectively in two adjacent subpixel areas of the plurality of subpixel areas at least partially overlaps with an orthographic projection of a same individual one of the plurality of auxiliary electrodes. Optionally, the auxiliary electrode layer and the first electrode layer are formed so that an orthographic projection of each of two adjacent auxiliary electrodes of the plurality of auxiliary electrodes on the base substrate at least partially overlaps with an orthographic projection of a same individual one of the plurality of first electrodes. Optionally, the auxiliary electrode layer and the first electrode layer are formed so that an orthographic projection of each of two adjacent first electrodes of the plurality of first electrodes respectively in two adjacent subpixel areas of the plurality of subpixel areas at least partially overlaps with an orthographic projection of a same individual one of the plurality of auxiliary electrodes; and an orthographic projection of each of two adjacent auxiliary electrodes of the plurality of auxiliary electrodes on the base substrate at least partially overlaps with an orthographic projection of a same individual one of the plurality of first electrodes.

Optionally, the plurality of auxiliary electrodes are formed to be spaced apart from each other. Optionally, the plurality of auxiliary electrodes are formed to interconnect with each other and constitute an integral electrode layer.

In some embodiments, the method further includes forming a plurality of vias extending through the auxiliary electrode layer. Each individual one of the plurality of first electrodes is formed to be electrically connected to the pixel circuit through a respective one of the plurality of vias.

In some embodiments, the method further includes forming a pixel definition layer for defining a plurality of pixel apertures. Optionally, the insulating layer is formed on a side of the pixel definition layer and the first electrode layer facing the base substrate.

In some embodiments, the insulating layer is formed so that thicknesses of the insulating layer respectively in three adjacent subpixel areas are different from each other.

In some embodiments, the method further includes thrilling a pixel definition layer for defining a plurality of pixel apertures, inside each of which a respective one of the plurality of first electrodes and a respective one of the plurality of auxiliary electrodes are disposed.

In some embodiments, the method further includes forming a plurality of vias extending through the insulating layer. Each individual one of the plurality of first electrodes is electrically connected to the pixel circuit through a respective one of the plurality of vias.

In some embodiments, the method further includes forming a second electrode layer; forming an organic light emitting layer in the plurality of pixel apertures and between the first electrode layer and the second electrode layer; and forming a plurality of thin film transistors configured to drive light emission of the display substrate. Each of the plurality of first electrodes is formed to be electrically connected to a drain electrode of a respective one of the plurality of thin film transistors.

In some embodiments, the method further includes forming an auxiliary voltage terminal. Optionally, the auxiliary electrode layer is formed to be electrically connected to an auxiliary voltage terminal. Optionally, the method further includes forming an auxiliary electrode signal line electrically connected to the auxiliary voltage terminal. Optionally, the auxiliary voltage terminal is a common voltage terminal electrically connected to a common electrode signal line configured to provide a common voltage.

In another aspect, the present disclosure provides a display panel having the display substrate described herein or fabricated by a method described herein. In another aspect, the present disclosure provides a display apparatus having the display substrate described herein or fabricated by a method described herein, Optionally, the display apparatus is an organic light emitting diode display apparatus. Examples of appropriate display apparatuses include, but are not limited to, an electronic paper, a mobile phone, a tablet computer, a television, a monitor, a notebook computer, a digital album, a GPS, etc.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A display substrate having a plurality of subpixel areas, comprising:
   a base substrate;
   a first electrode layer on the base substrate and comprising a plurality of first electrodes respectively in the plurality of subpixel areas;

an auxiliary electrode layer;
an insulating layer between the first electrode layer and the auxiliary electrode layer;
an auxiliary voltage terminal; and
an auxiliary electrode signal line;
wherein the first electrode layer and the auxiliary electrode layer are spaced apart and insulated from each other by the insulating layer;
an orthographic projection of each individual one of the plurality of first electrodes on the base substrate at least partially overlap with an orthographic projection of the auxiliary electrode layer on the base substrate;
each of the plurality of first electrodes is electrically connected to a pixel circuit configured to drive light emission in a respective one of the plurality of subpixel areas;
the auxiliary electrode layer is electrically connected to the auxiliary voltage terminal; and
the auxiliary electrode signal line is electrically connected to the auxiliary voltage terminal.

2. The display substrate of claim 1, wherein the auxiliary electrode layer comprises a plurality of auxiliary electrodes; and
an orthographic projection of each individual one of the plurality of auxiliary electrodes on the base substrate at least partially overlaps with an orthographic projection of one or multiple of the plurality of first electrodes on the base substrate.

3. The display substrate of claim 2, wherein the orthographic projection of each individual one of the plurality of auxiliary electrodes on the base substrate at least partially overlaps with a respective one of the plurality of first electrodes on the base substrate.

4. The display substrate of claim 2, wherein an orthographic projection of each of two adjacent first electrodes of the plurality of first electrodes respectively in two adjacent subpixel areas of the plurality of subpixel areas at least partially overlaps with an orthographic projection of a same individual one of the plurality of auxiliary electrodes.

5. The display substrate of claim 2, wherein an orthographic projection of each of two adjacent auxiliary electrodes of the plurality of auxiliary electrodes on the base substrate at least partially overlaps with an orthographic projection of a same individual one of the plurality of first electrodes.

6. The display substrate of claim 2, wherein an orthographic projection of each of two adjacent first electrodes of the plurality of first electrodes respectively in two adjacent subpixel areas of the plurality of subpixel areas at least partially overlaps with an orthographic projection of a same individual one of the plurality of auxiliary electrodes; and
an orthographic projection of each of two adjacent auxiliary electrodes of the plurality of auxiliary electrodes on the base substrate at least partially overlaps with an orthographic projection of a same individual one of the plurality of first electrodes.

7. The display substrate of claim 2, wherein the plurality of auxiliary electrodes are spaced apart from each other.

8. The display substrate of claim 7, further comprising a pixel definition layer for defining a plurality of pixel apertures, inside each of which a respective one of the plurality of first electrodes and a respective one of the plurality of auxiliary electrodes are disposed.

9. The display substrate of claim 8, wherein the display substrate comprises a plurality of vias extending through the insulating layer; and
each individual one of the plurality of first electrodes is electrically connected to the pixel circuit through a respective one of the plurality of vias.

10. The display substrate of claim 2, wherein the plurality of auxiliary electrodes interconnect with each other and constitute an integral electrode layer.

11. The display substrate of claim 10, wherein the display substrate comprises a plurality of vias extending through the auxiliary electrode layer; and
each individual one of the plurality of first electrodes is electrically connected to the pixel circuit through a respective one of the plurality of vias.

12. The display substrate of claim 1, further comprising a pixel definition layer for defining a plurality of pixel apertures;
wherein the insulating layer is on a side of the pixel definition layer and the first electrode layer facing the base substrate.

13. The display substrate of claim 1, further comprising:
a second electrode layer;
an organic light emitting layer in a plurality of pixel apertures and between the first electrode layer and the second electrode layer; and
a plurality of thin film transistors configured to drive light emission of the display substrate;
wherein each of the plurality of first electrodes is electrically connected to a drain electrode of a respective one of the plurality of thin film transistors.

14. The display substrate of claim 1, wherein the auxiliary voltage terminal is a common voltage terminal electrically connected to a common electrode signal line configured to provide a common voltage.

15. A display apparatus, comprising the display substrate of claim 1.

16. A display substrate having a plurality of subpixel areas, comprising:
a base substrate;
a first electrode layer on the base substrate and comprising a plurality of first electrodes respectively in the plurality of subpixel areas;
an auxiliary electrode layer;
an insulating layer between the first electrode layer and the auxiliary electrode layer; and
a pixel definition layer for defining a plurality of pixel apertures;
wherein the first electrode layer and the auxiliary electrode layer are spaced apart and insulated from each other by the insulating layer;
an orthographic projection of each individual one of the plurality of first electrodes on the base substrate at least partially overlap with an orthographic projection of the auxiliary electrode layer on the base substrate; and
each of the plurality of first electrodes is electrically connected to a pixel circuit configured to drive light emission in a respective one of the plurality of subpixel areas;
the insulating layer is on a side of the pixel definition layer and the first electrode layer facing the base substrate;
thicknesses of the insulating layer respectively in three adjacent subpixel areas are different from each other;
the first electrode layer is a substantially transparent electrode; and
the auxiliary electrode layer is a reflective electrode.

17. A method of fabricating a display substrate having a plurality of subpixel areas, comprising:
forming a first electrode layer on a base substrate;
forming an auxiliary electrode layer;

forming an insulating layer;
forming a pixel circuit configured to drive light emission in a respective one of the plurality of subpixel areas;
forming an auxiliary voltage terminal; and
forming an auxiliary electrode signal line;
wherein forming the first electrode layer comprises forming a plurality of first electrodes respectively in the plurality of subpixel areas;
the insulating layer is formed between the first electrode layer and the auxiliary electrode layer;
the first electrode layer and the auxiliary electrode layer are formed to be spaced apart and insulated from each other by the insulating layer;
the first electrode layer and the auxiliary electrode layer are formed so that an orthographic projection of each individual one of the plurality of first electrodes on the base substrate at least partially overlap with an orthographic projection of the auxiliary electrode layer on the base substrate;

each of the plurality of first electrodes is formed to be electrically connected to a pixel circuit;

the auxiliary electrode layer is electrically connected to the auxiliary voltage terminal; and the auxiliary electrode signal line is electrically connected to the auxiliary voltage terminal.

18. The method of claim 17, wherein forming the auxiliary electrode layer comprises forming a plurality of auxiliary electrodes; and wherein the auxiliary electrode layer and the first electrode layer are formed so that an orthographic projection of each individual one of the plurality of auxiliary electrodes on the base substrate at least partially overlaps with an orthographic projection of one or multiple of the plurality of first electrodes on the base substrate.

\* \* \* \* \*